(12) United States Patent
Suzuki et al.

(10) Patent No.: US 8,431,974 B2
(45) Date of Patent: Apr. 30, 2013

(54) SILICON CARBIDE SEMICONDUCTOR DEVICE

(75) Inventors: Takuma Suzuki, Kawasaki (JP); Hiroshi Kono, Kawasaki (JP); Takashi Shinohe, Yokosuka (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 184 days.

(21) Appl. No.: 12/846,400

(22) Filed: Jul. 29, 2010

(65) Prior Publication Data

US 2010/0308343 A1  Dec. 9, 2010

Related U.S. Application Data

(63) Continuation of application No. PCT/JP2009/050789, filed on Jan. 14, 2009.

(30) Foreign Application Priority Data

Jan. 31, 2008 (JP) ................................ 2008-022001

(51) Int. Cl.
*H01L 29/66* (2006.01)
(52) U.S. Cl.
USPC ................. 257/287; 257/341; 257/E21.066
(58) Field of Classification Search .................. 257/287, 257/341, E21.066
See application file for complete search history.

(56) References Cited

U.S. PATENT DOCUMENTS

| | | | |
|---|---|---|---|
| 6,096,607 A * | 8/2000 | Ueno | 438/268 |
| 6,482,704 B1 * | 11/2002 | Amano et al. | 438/285 |
| 6,724,039 B1 | 4/2004 | Blanchard | |
| 7,221,010 B2 * | 5/2007 | Ryu | 257/287 |
| 7,569,900 B2 | 8/2009 | Imai et al. | |
| 2006/0108589 A1 | 5/2006 | Fukuda et al. | |
| 2008/0017897 A1 | 1/2008 | Saito et al. | |
| 2009/0078942 A1 | 3/2009 | Kono et al. | 257/77 |

FOREIGN PATENT DOCUMENTS

| | | |
|---|---|---|
| JP | 10-308510 A | 11/1998 |
| JP | 11068097 A | 3/1999 |
| JP | 2003-86802 A | 3/2003 |
| JP | 2004071750 A | 3/2004 |
| JP | 2005310886 A | 11/2005 |
| JP | 2007207784 A | 8/2007 |

OTHER PUBLICATIONS

U.S. Appl. No. 12/199,848, filed Aug. 28, 2008, Kono et al.

(Continued)

*Primary Examiner* — Steven J Fulk
(74) *Attorney, Agent, or Firm* — Ohlandt, Greeley, Ruggiero & Perle, L.L.P.

(57) ABSTRACT

According to the embodiment, a semiconductor device includes an SiC substrate of a first or second conductivity type. An SiC layer of the first conductivity type is formed on a front surface of the substrate, a first SiC region of the second conductivity type is formed on the SiC layer, a second SiC region of the first conductivity type is formed within a surface of the first SiC region, a gate dielectric is continuously formed on the SiC layer, the second SiC region, and the surface of the first SiC region interposed between the SiC layer and the second SiC region, a gate electrode is formed on the gate dielectric, a first electrode is embedded in a trench selectively formed in a part where the first SiC region adjoins the second SiC region, and a second electrode is formed on a back surface of the substrate.

7 Claims, 9 Drawing Sheets

OTHER PUBLICATIONS

Senzaki, U., et al., "Reliability of Thermal Oxides Grwon on n-type 4H-SiC Implanted with Low Nitrogen Concentration," International Conference Silicon Carbide and Related Materials, 2007, Mo-P-68, 2 pp.

Ngano, M., et al., "Detection and Characterization of Defects Induced by Ion Implantation/Annealing process in SiC," International Conference Silicon Carbide and Related Materials, 2007, Mo-P-14, 2 pp.

International Search Report corresponding to International Patent Application No. PCT/JP2009/050789 dated Apr. 16, 2009.

First Office Action dated Oct. 23, 2012 for corresponding Japanese Patent Application No. 2008-022001 with English translation consisting of 6 pages.

Office Action dated Jan. 8, 2013 for corresponding Japanese Patent Application No. 2008-022001 with English translation; 5 pages.

* cited by examiner

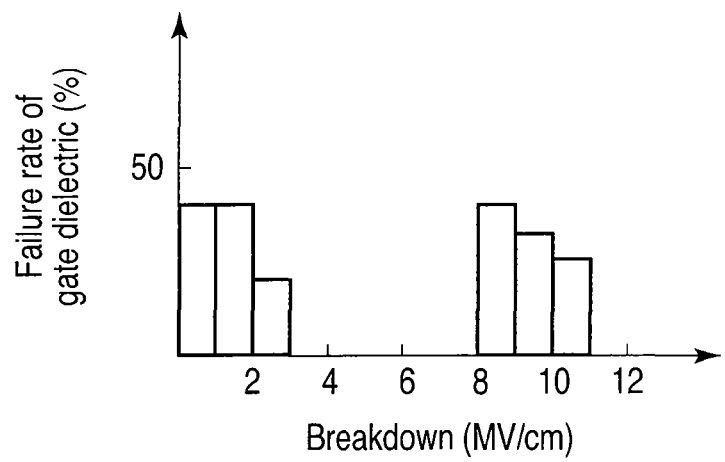
F I G. 3
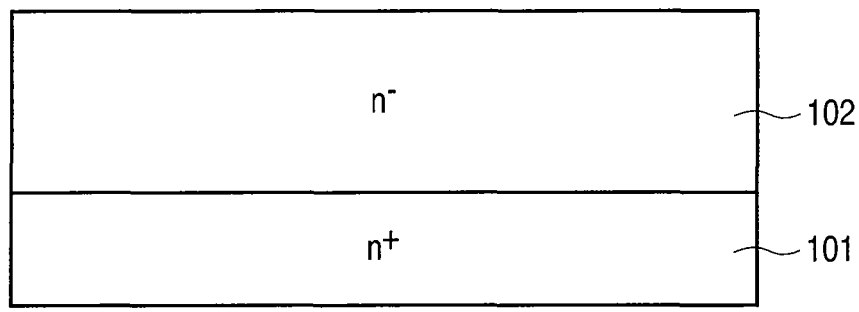
F I G. 4
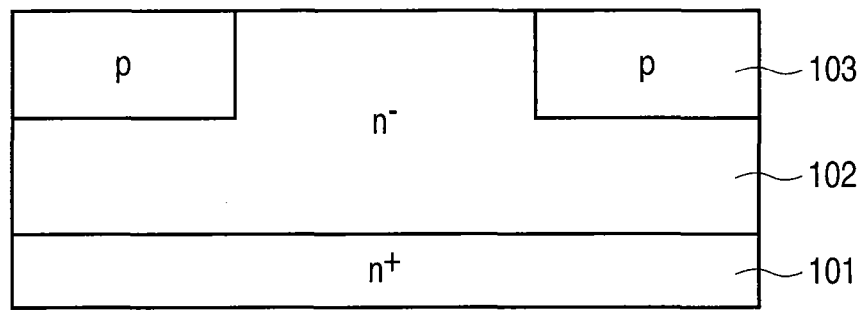
F I G. 5

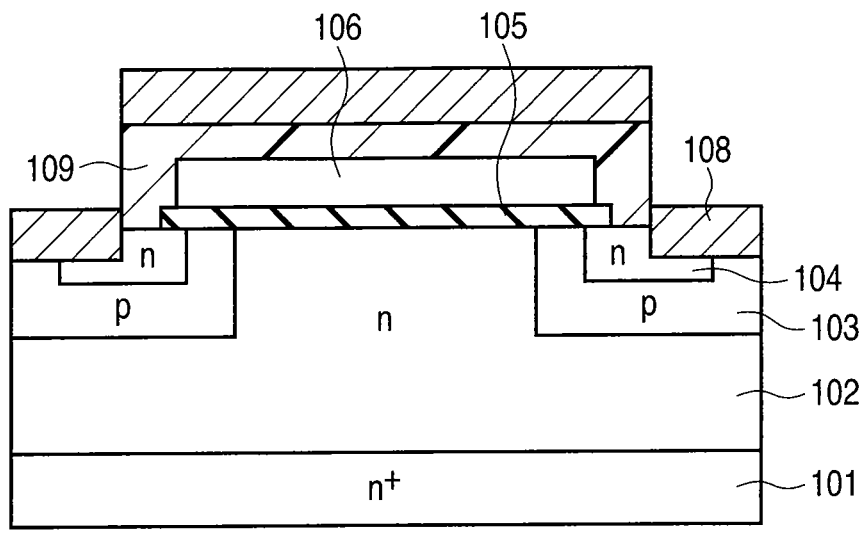
F I G. 9
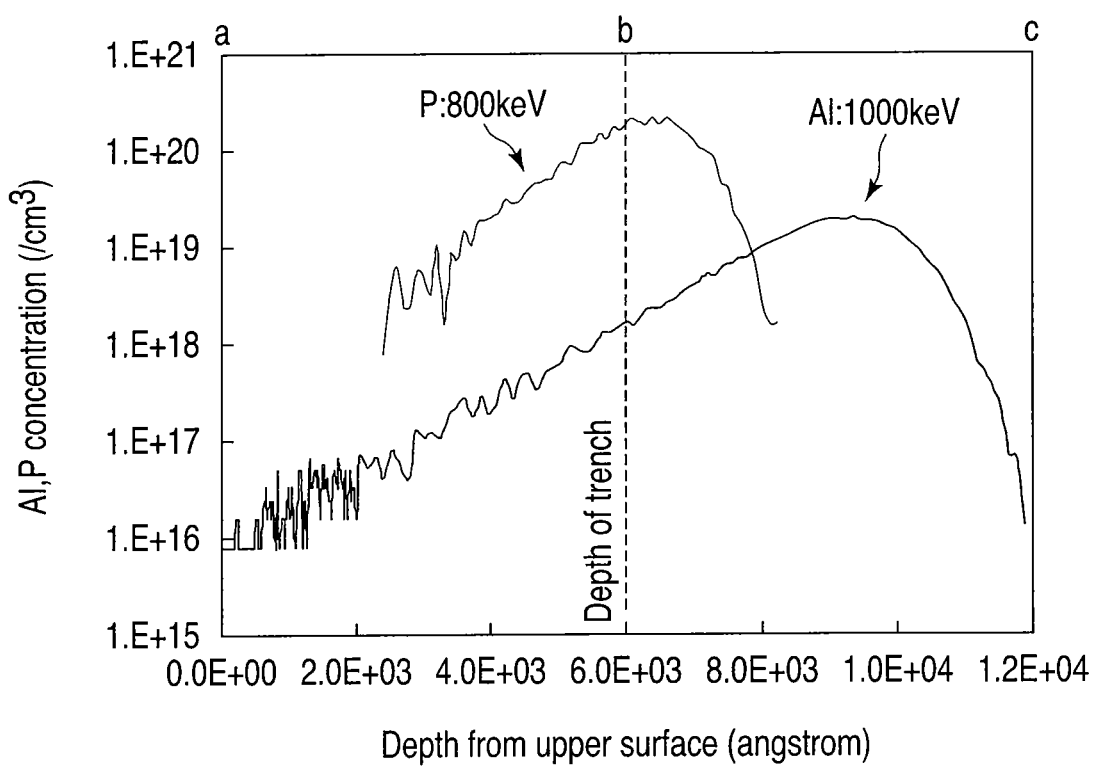
F I G. 10

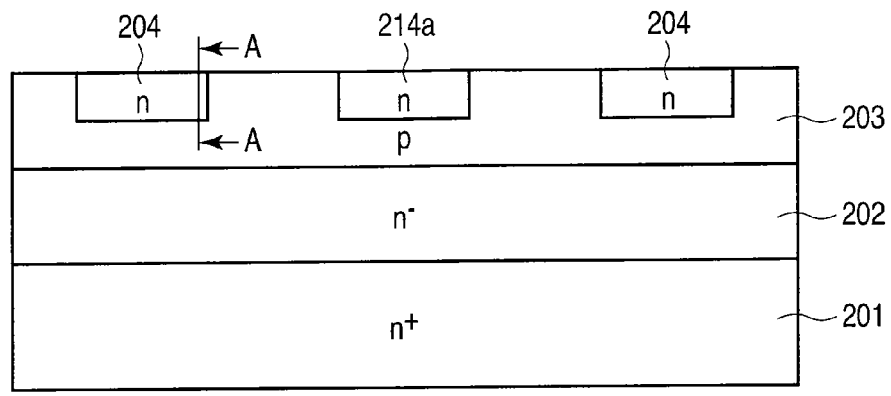
F I G. 14
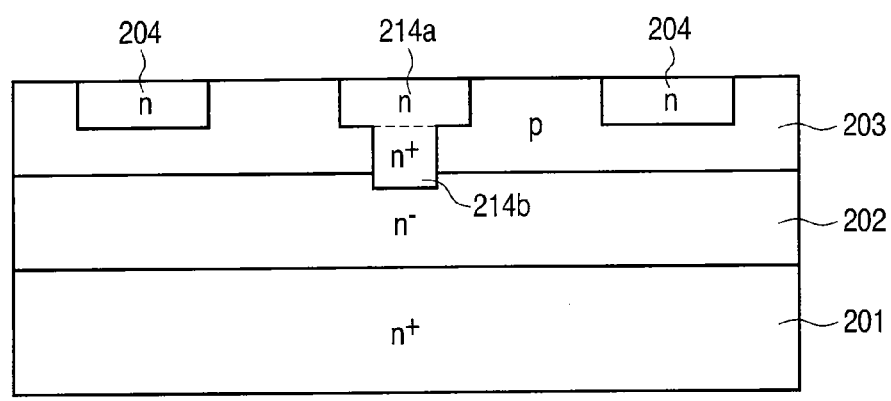
F I G. 15
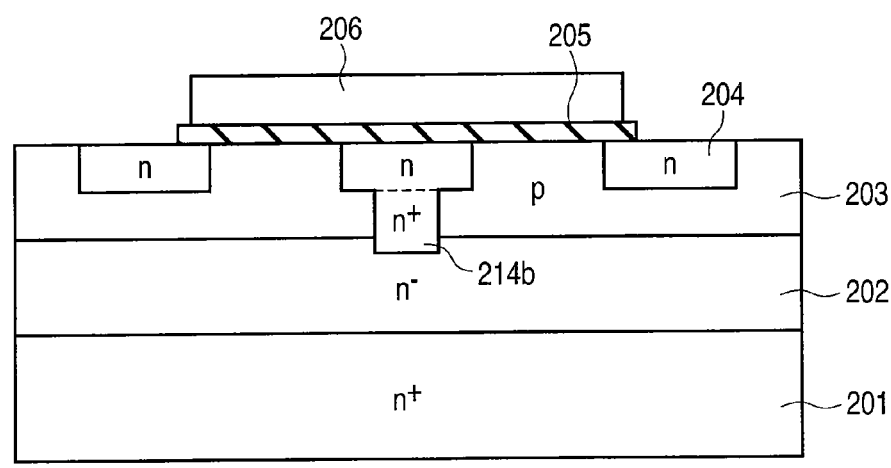
F I G. 16

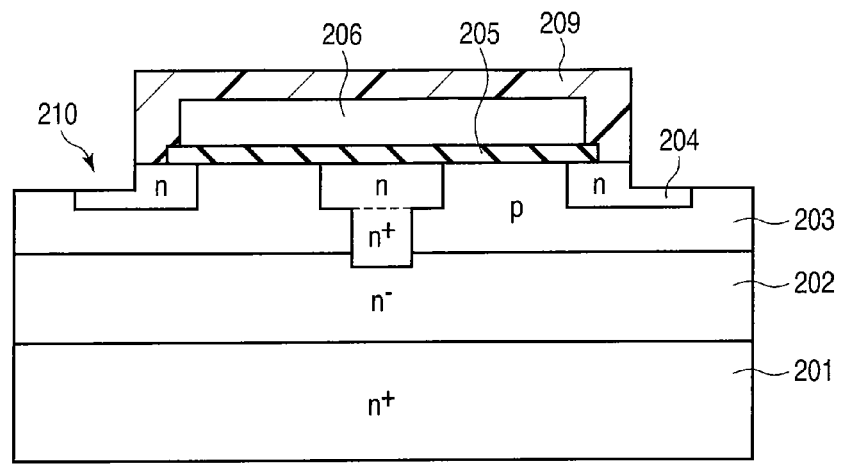
F I G. 17
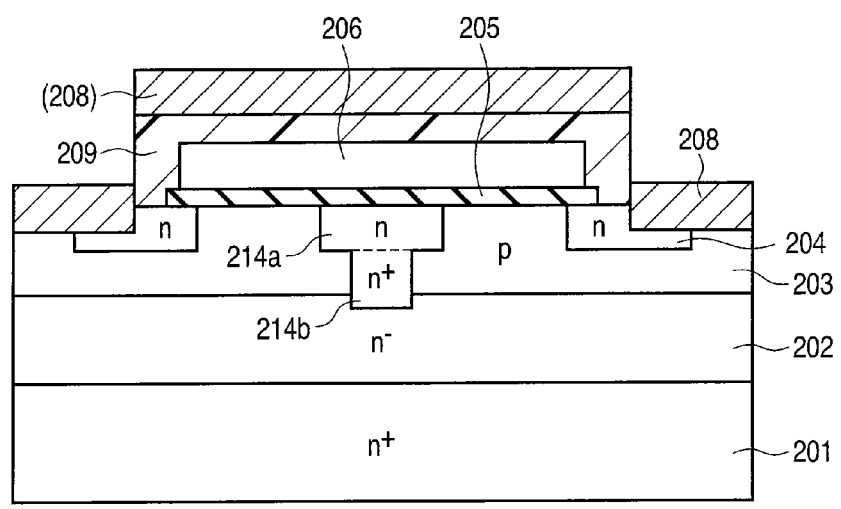
F I G. 18
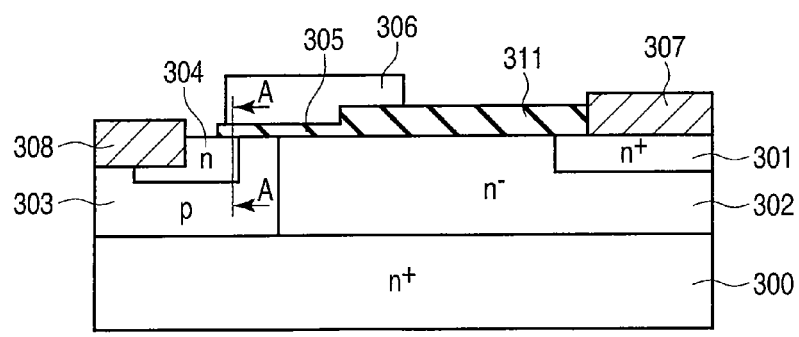
F I G. 19

US 8,431,974 B2

SILICON CARBIDE SEMICONDUCTOR DEVICE

CROSS REFERENCE TO RELATED APPLICATIONS

This is a Continuation Application of PCT Application No. PCT/JP2009/050789, filed Jan. 14, 2009, which was published under PCT Article 21(2) in English.

This application is based upon and claims the benefit of priority from Japanese Patent Application No. 2008-022001, filed Jan. 31, 2008; the entire contents of which are incorporated herein by reference.

FIELD

Embodiments described herein relate generally to a high breakdown voltage semiconductor device such as a MOSFET for power control using a silicon carbide semiconductor (SiC) as a material.

BACKGROUND

There are high expectations for SiC as a next-generation power semiconductor device material. SiC is about three times as high in band gap, about ten times as high in breakdown field strength and about three times as high in thermal conductivity as Si, and has good physical properties as a power semiconductor device material. The use of such physical properties makes it possible to obtain a power semiconductor device enabling far lower loss than an Si power semiconductor device, as well as high-temperature operation.

While there are various high breakdown voltage semiconductor devices using the characteristics of SiC, a double implantation MOSFET (hereinafter referred to as a DIMOSFET), for example, is known in which a p-well and a source region are formed by ion implantation. The DIMOSFET is easy to manufacture because it uses a planar process, which enables more accurate channel formation by an ion implantation method. Moreover, the DIMOSFET allows a drive circuit of lower power because gate driving is performed by voltage control, and the DIMOSFET is therefore a good device suitable for parallel operation as well.

However, the DIMOSFET has the following problems. An n-type source region of the SiC-DIMOSFET is generally formed by high-dose ion implantation with nitrogen or phosphorus which is then thermally treated for activation at about 1600° C. At this point, the ion implantation is carried out under a high-dose condition up to the surface of SiC in a box profile, and the thermal treatment at a high temperature of about 1600° C. is used, which leads to considerable damage to an ion-implanted region of the SiC surface. As a result, a priority sublimation phenomenon of Si occurs starting from the implantation region. This causes surface roughening on the source region for 10 nm or more, and then, when a gate dielectric is formed over the source region and a p-type base region by, for example, a thermal oxidation method or a CVD method, the surface roughening on the source region is directly reflected on the gate dielectric on the source region. This leads to a significant decrease in the breakdown voltage, breakdown yield and long-term electrical reliability of the gate dielectric.

Although it is generally said that the surface roughening on the source region is reduced in the case of nitrogen ion implantation, it has been reported that surface roughness increases with a high ion implantation concentration even in the case of nitrogen and the breakdown yield decreases (refer to Junji Senzaki et al., ICSCRM2007, Mo-P-68). Moreover, it has also been reported that a new crystal defect could be induced by nitrogen implantation and activation annealing (refer to M. Nagano et al., ICSCRM2007, Mo-P-14).

In order to solve the problem of the ion implantation, a double epitaxial MOSFET (DEMOSFET) in which a p-type base region (well) is formed by an epitaxially formed film alone has been reported. However, the above-mentioned method utilizes epitaxial growth which requires a long time for a manufacturing process.

As described above, the problems with the conventional DIMOSFET are that surface roughening is caused on the source region due to the high-temperature thermal treatment after the phosphorus or nitrogen ion implantation, and when the gate dielectric is then formed, the surface roughening on the source region is directly reflected on the gate dielectric on the source region, leading to a significant decrease in the breakdown voltage, breakdown yield and long-term electrical reliability of the gate dielectric.

Although the DEMOSFET in which the p-type base region (well) is formed by the epitaxially formed film alone has been reported to solve the above-mentioned problem, this method utilizes epitaxial growth, which requires a long time for the manufacturing process.

Therefore, there has been a desire to obtain a silicon carbide semiconductor device capable of reducing the process time, capable of high performance with extremely low on-resistance using physical properties intrinsic in SiC and capable of greatly improving the breakdown voltage, breakdown yield and long-term reliability of the gate dielectric.

BRIEF DESCRIPTION OF THE DRAWINGS

FIG. 3 is a histogram of the breakdown failure rate of a gate dielectric in a general DIMOSFET;

FIGS. 4 to 9 are sectional views for explaining stepwise the process of manufacturing the DIMOSFET according to the first embodiment;

FIG. 10 is a concentration profile of phosphorus and aluminum in the substrate depth direction along the line A-A in FIG. 1, according to a first modification;

FIGS. 13 to 18 are sectional views for explaining stepwise the process of manufacturing the DIMOSFET according to the second embodiment;

FIG. 19 is a sectional view of a horizontal DIMOSFET according to a third embodiment.

DETAILED DESCRIPTION

In general, according to one embodiment, a semiconductor device includes a silicon carbide substrate, a silicon carbide layer formed on the first main surface of the substrate, a first silicon carbide region formed on the silicon carbide layer, a second silicon carbide region formed within the first silicon carbide region, a gate dielectric formed above the first main surface of the substrate, a gate electrode formed on the gate dielectric, a first electrode embedded in a trench formed in the first main surface of the substrate and a second electrode formed on the second main surface of the substrate.

The silicon carbide substrate is of a first conductivity type or a second conductivity type and has the first main surface and the second main surface opposite to each other. The silicon carbide layer is of the first conductivity type and formed on the first main surface of the silicon carbide substrate. The first silicon carbide region is of the second conductivity type and formed on a surface of the silicon carbide layer. The second silicon carbide region is of the first conductivity type and formed within a surface of the first silicon carbide region. A gate dielectric is continuously formed on the silicon carbide layer, the second silicon carbide region and the surface of the first silicon carbide region interposed between the silicon carbide layer and the second silicon carbide region. The gate electrode is formed on the gate dielectric. The first electrode is embedded in the trench selectively formed in an area including a part where the first silicon carbide region adjoins the second silicon carbide region. The second electrode is formed on the second main surface of the silicon carbide substrate.

According to embodiments to be described hereinafter, a peak position of the ion implantation impurity concentration in a source part is located within a substrate, and a source recess dug down to the peak position is provided, such that roughening of the surface of a gate dielectric on a source region can be inhibited, and low contact resistance of a source electrode can be maintained. Thus, it is possible to obtain a high breakdown voltage semiconductor device having high performance with extremely low on-resistance purely utilizing the physical properties of SiC, and the reliability of the gate dielectric can be improved to a great extent.

The embodiments will hereinafter be described with reference to the drawings. It is to be noted that the drawings are schematic and that the relation between the thickness and planar dimensions, the ratio of the thickness of layers, etc. are different from real ones. Therefore, the following description should be considered to judge specific thicknesses and dimensions. It should also be noted that the drawings include parts in which the relation and ratio of dimensions are different.

First Embodiment

Figure 1:
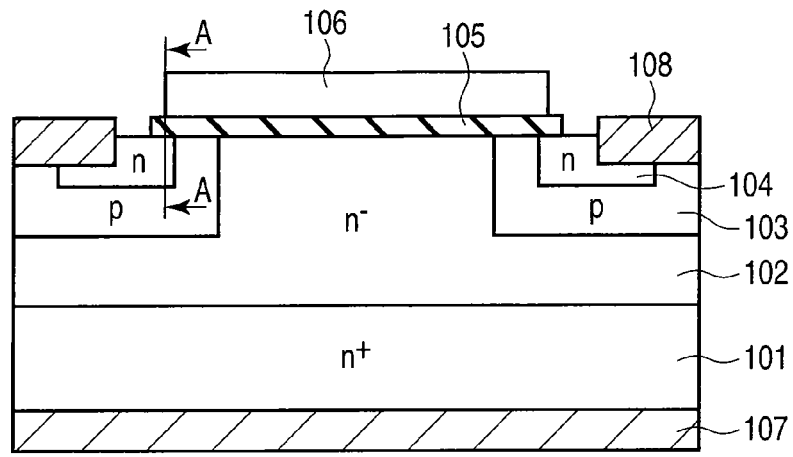
FIG. 1 is a sectional view of a DIMOSFET according to a first embodiment.

FIG. 1 is a sectional view showing the configuration of a DIMOSFET according to a first embodiment. In FIG. 1, an SiC layer (n⁻ layer) 102 including an n-type impurity concentration of about $5\times10^{15}$ to $2\times10^{16}/cm^3$ and having a thickness of about 5 to 10 μm is formed on a hexagonal SiC substrate (n⁺ substrate) 101 containing an n-type impurity with a concentration of about $5\times10^{18}$ to $1\times10^{19}/cm^3$. On part of the surface of the SiC layer 102, a first silicon carbide region 103 (p-type well) exists in a region up to a depth of 900 nm from the surface of the SiC layer 102 and is formed so that the concentration of aluminum (Al) as a p-type impurity changes from about $1\times10^{16}$ to $2\times10^{19}/cm^3$ (peak concentration) in the depth direction from the surface. This p-type well serves as a p-type base region 103.

Figure 2:
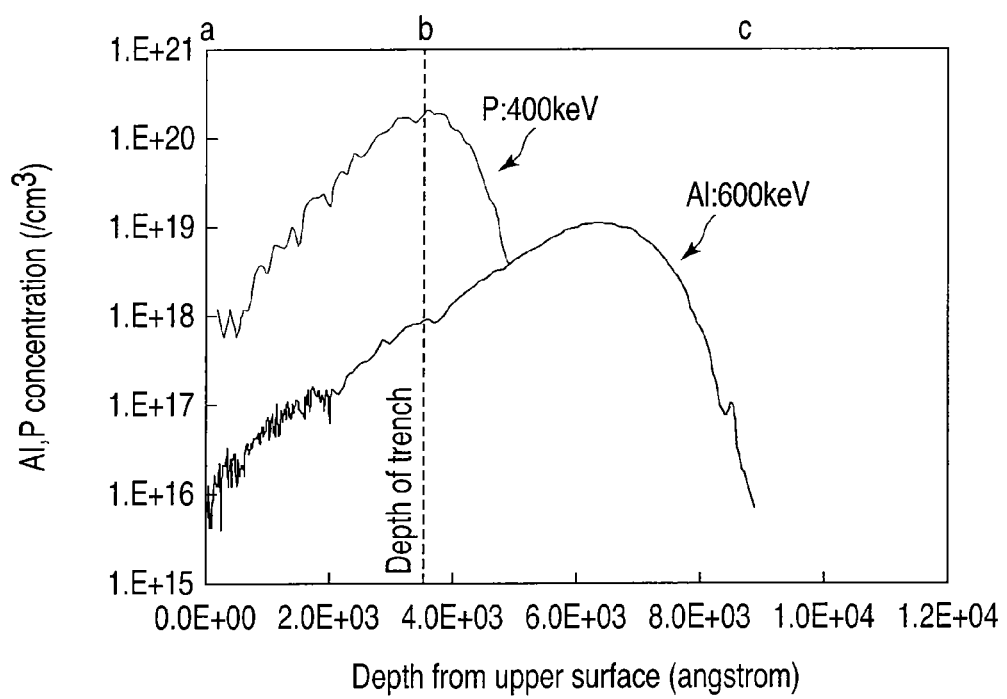
FIG. 2 is a concentration profile of phosphorus and aluminum in a substrate depth direction along the line A-A in FIG. 1.

An n-type source region 104 is formed as a second silicon carbide region within the p-type base region 103. More specifically, the source region 104 in which the concentration of nitrogen (N) as an n-type impurity changes from about $1\times10^{18}/cm^3$ to $2\times10^{20}/cm^3$ (peak concentration) in the depth direction from the surface exists in a region up to a depth of 500 nm from the surface of the SiC layer 102. FIG. 2 shows an n-type impurity distribution in a depth direction in a section along the line A-A in FIG. 1. This impurity distribution will be described later.

From the outer side of the p-type base region 103 to part of the n-type source region 104, a trench having a depth of 350 nm is formed in their surfaces, and a source electrode (first electrode) 108 is formed within this trench.

In a part extending from part of the inner surface of the source region 104 to the surfaces of the base region 103 and the SiC layer 102, a gate dielectric 105 having a thickness of about 50 nm is formed across these regions. A gate electrode 106 made of polysilicon is formed on the gate dielectric 105. Further, a drain electrode (second electrode) 107 is formed on the lower surface of the SiC substrate 101.

In the semiconductor device in the first embodiment, the surface of the p-type base region 103 in direct contact with the gate dielectric 105 is formed to have a relatively low impurity concentration of $1\times10^{16}/cm^3$ as shown in FIG. 2, but its surface in contact with the source electrode 108, that is, the bottom of the trench is formed to have a relatively high concentration of $1\times10^{18}/cm^3$. Therefore, the p-type base region 103 can be in ohmic contact with the source electrode 108.

On the other hand, the surface of the n-type source region 104 in direct contact with the gate dielectric 105 is formed to have a relatively low impurity concentration of $1\times10^{18}/cm^3$ as shown in FIG. 2, but its surface in contact with the source electrode 108, that is, the bottom of the trench is formed to have a relatively high concentration (n⁺) of $2\times10^{20}/cm^3$. Therefore, the n-type source region 104 can be in ohmic contact with the source electrode 108.

In such a configuration, the gate dielectric 105 in contact with the source region 104 is improved in roughness and crystallinity, which makes it possible to reduce a decrease in inversion channel mobility due to the roughness and improve the reliability of the gate dielectric 105. Moreover, p⁺ ion implantation into the p-type base region 103 which has heretofore been carried out is no longer necessary, leading to a simplified process.

Specifically, when the source region in direct contact with the gate dielectric is formed with a concentration of about $1\times10^{20}/cm^3$ using phosphorus as in the conventional case, a defective device is mixed in which the histogram of a gate dielectric breakdown voltage is distributed at 0 to 3 MV/cm due to implantation damage, as shown in FIG. 3. On the contrary, as in the present embodiment, when the surface in direct contact with the gate dielectric 105 is formed to have a relatively low impurity concentration of $1\times10^{18}/cm^3$ as shown in FIG. 2, generation of the defective device is inhibited, the implantation damage is significantly reduced, and the histogram of the gate dielectric breakdown voltage is only distributed at 8 MV/cm or more, thus enabling a gate dielectric of extremely high reliability.

As described above, in the semiconductor device in the first embodiment, the impurity concentration of the base region in contact with the gate dielectric is lower than the impurity concentration of the surface of the base region exposed in the trench. Moreover, the impurity concentration of the surface of the source region exposed in the trench is higher than the impurity concentration of the part of the source region in contact with the gate dielectric.

Furthermore, when the base region contains aluminum as an impurity, the concentration of aluminum in the part in contact with the gate dielectric is less than $1\times10^{17}/cm^3$, and the concentration of aluminum in the surface exposed in the trench is $1\times10^{17}/cm^3$ or more. When the source region contains phosphorus as an impurity, the concentration of phosphorus in the part in contact with the gate dielectric is less than $1\times10^{19}/cm^3$, and the concentration of phosphorus in the surface exposed in the trench is $1\times10^{19}/cm^3$ or more.

Next, a method of manufacturing the above semiconductor device is described with FIGS. 4 to 9. First, as shown in FIG. 4, the highly resistant (n⁻-type) SiC layer 102 which contains nitrogen (N) as an n-type impurity with a surface impurity concentration of $1\times10^{16}/cm^3$ and which has a thickness of 10 μm is sequentially formed by an epitaxial growth method on the low resistant 4H—SiC substrate 101 which contains nitrogen as an n-type impurity with an impurity concentration of $1\times10^{19}/cm^3$ and which has a thickness of 300 μm and which has a hexagonal crystal lattice. Although nitrogen (N) is used as the n-type impurity here, other impurities such as phosphorus (P) may be used. Alternatively, nitrogen and phosphorus may be used at the same time. Subsequently, a silicon oxide film (not shown) is formed on the surface of the SiC layer 102.

Then, the surface of the silicon oxide film (not shown) is spin-coated with a resist (not shown), and the resist is patterned by a photolithographic technique. Using the patterned resist as an etching mask, the silicon oxide film is subjected to isotropic etching such as RIE.

Thus, an ion implantation mask (not shown) in a later-mentioned ion implantation step is formed. Selective Al ion implantation into the SiC layer 102 via the ion implantation mask is carried out. Multistage ion implantation is carried out for Al under the conditions of: substrate temperature Tsub=room temperature to 600° C., here, room temperature, acceleration energy Eacc=600 keV, and total dose ϕ=2.5× $10^{14}/cm^2$. As a result, the base region 103 containing the p-type impurity is formed in a region of a depth of 900 nm from the surface, as shown in FIG. 5.

Figure 6:
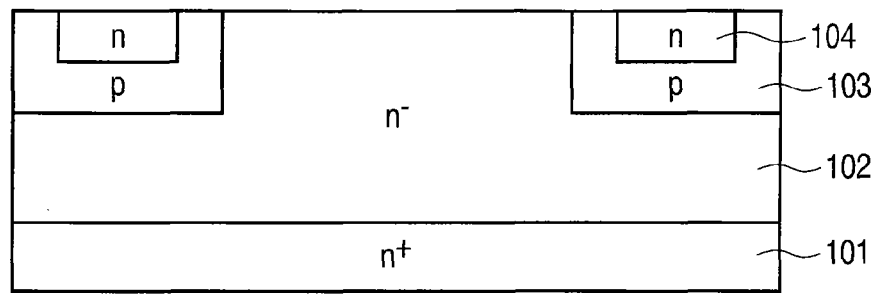

Then, as shown in FIG. 6, the source region 104 is selectively formed in the base region 103 by ion implantation. Specifically, multistage phosphorus (P) ion implantation is carried out with the substrate heated to a temperature of about 600° C. under the conditions of: acceleration energy=400 keV, and total dose=$3\times10^{15}/cm^2$. At this point, an impurity concentration distribution in a direction along the line A-A in FIG. 1 is as shown in FIG. 2, as described above. Subsequently, the implanted impurity is activated by a thermal treatment at about 1600° C.

Figure 7:
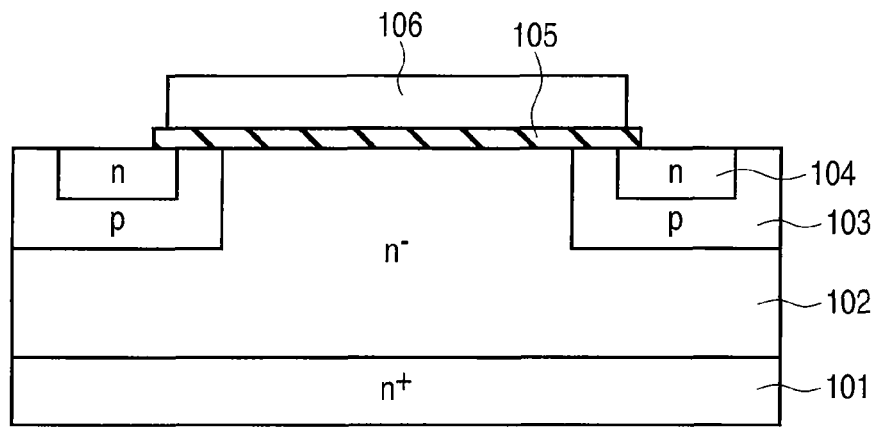

Then, as shown in FIG. 7, the gate dielectric 105 is selectively formed by, for example, the thermal oxidation method or CVD method across the SiC layer 102, the base region 103 and the source region 104. At this point, the surface of the source region 104 in direct contact with the gate dielectric 105 is formed to have a relatively low impurity concentration of $1\times10^{18}/cm^3$ as described above, and this inhibits surface roughening due to the high-temperature treatment, so that a flat and dense gate dielectric 105 can be formed on the source region 104, thereby enabling a significant improvement in the long-term reliability of the gate dielectric 105. At this point, the impurity concentration of the surface of the p-type base region 103 in direct contact with the gate dielectric 105 is also $1\times10^{18}/cm^3$. Further, a polysilicon layer is formed on the gate dielectric 105 by the CVD method, and the polysilicon layer is patterned by lithography or the RIE method to form the gate electrode 106.

Figure 8:
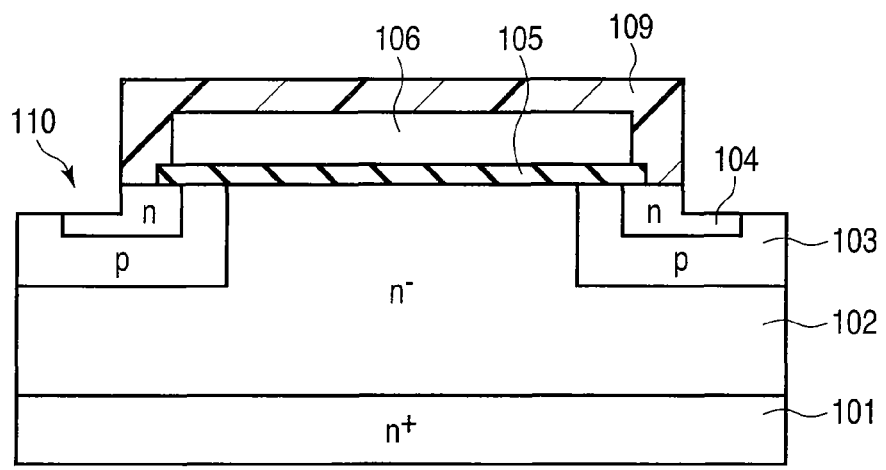

Then, as shown in FIG. 8, a resist 109 covering the gate electrode 106 is formed, and using the resist 109 as a mask, a trench 110 is formed in the surfaces of the n-type source region 104 and the p-type base region 103 by isotropic etching such as RIE. At this point, the n-type source region exposed in the bottom of the trench is an n⁺ type with an impurity concentration of $2\times10^{20}/cm^3$, and forms a satisfactory ohmic contact with the source electrode to be formed later.

Then, as shown in FIG. 9, an Ni film is formed on the source region 104 by vapor deposition, and the source electrode 108 is selectively formed by a liftoff method. Further, the drain electrode 107 is also formed on the rear surface by the vapor deposition of an Ni film. Finally, a sinter treatment is performed at 950° C. for about five minutes to provide a satisfactory ohmic contact between the source electrode 108 and the drain electrode 107. Consequently, the DIMOSFET in the first embodiment shown in FIG. 1 is completed.

In the DIMOSFET manufactured as described above, the n-type impurity is formed with a relatively low concentration in a relevant part within the source region in direct contact with the gate dielectric, such that surface roughening on the source region due to a high-temperature treatment of about 1600° C. is inhibited, and the flat and dense gate dielectric can be obtained on this region, and moreover, the reliability of the gate dielectric can be improved to a great extent.

Specifically, when the source region in direct contact with the gate dielectric is formed by the conventional method as shown in FIG. 3, a defective product is generated in which the histogram of the gate dielectric breakdown voltage is distributed at 0 to 3 MV/cm due to implantation damage. On the contrary, when the source region is formed by the method in the present embodiment, the implantation damage is significantly reduced, and the generation of the defective product is inhibited, such that the histogram of the gate dielectric breakdown voltage is only distributed at 8 MV/cm or more, thus enabling a gate electrode of extremely high reliability.

Next, a first modification according to the first embodiment is described. FIG. 10 is an impurity concentration profile where the impurity implantation energy in the p-type base region is increased so that the surface may be a p⁻ type while an internal peak concentration is further increased. Specifically, Al as the p-type impurity is set at a dose of $5\times10^{14}/cm^2$, a peak concentration of $2\times10^{19}/cm^3$ and a surface concentration of $1\times10^{16}/cm^3$, and phosphorus as an n-type impurity in the source region is set at a dose amount of $4\times10^{15}/cm^2$, a peak concentration of $2\times10^{20}/cm^3$ and a surface concentration of $1\times10^{17}/cm^3$, and the depth of the trench is set at 600 nm.

In such a configuration, high trench surface concentrations of $2\times10^{18}/cm^3$ and $2\times10^{20}/cm^3$ are achieved for the respective regions when punch-through is inhibited and the trench is dug to provide a contact between the p-type base region and the n-type source region, so that contact resistance can be reduced. Moreover, the impurity (phosphorus) concentration of the uppermost surface (surface in contact with the gate dielectric) of the n-type source region is reduced to $1\times10^{17}/cm^3$, such that the reliability and breakdown yield of the gate dielectric are further improved.

In the DIMOSFET, the surface p⁻-concentration can be controlled by controlling the amount of Al ion implanted into the p-type base region 103 or by counter-doping with, for example, nitrogen to obtain a desired threshold voltage. In that case, the amount of Al ion implanted into the p-type base region 103 can be further increased, and the p-type contact resistance of the trench can be further reduced.

Figure 11:
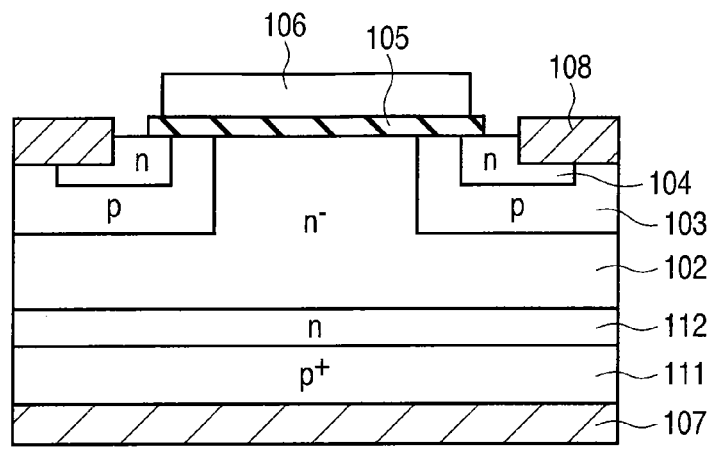
FIG. 11 is a sectional view of a (DI)IGBT according to a second modification.

Next, an application to an IGBT is described as a second modification. In the case of the IGBT, it is only necessary to change the SiC substrate to a p⁺-type substrate 111, and epitaxially grow the n⁻-type SiC layer 102 via an n-type layer 112, as shown in FIG. 11. As another manufacturing method, it is also possible to form the IGBT by sequential n-type impurity and p-type impurity ion implantation from the rear surface of the n⁻-type SiC layer 102.

As described above, according to the first embodiment, the n-type source region is provided with a gradient in which the concentration increases in the depth direction, and the gate dielectric is therefore formed on a low-concentration region, such that it is possible to expect an improvement in the reliability of the gate dielectric, a decrease in gate leakage, and an improvement in breakdown yield.

Furthermore, since the source electrode is provided so that it is embedded in the trench provided in the surface of the part where the n-type source region adjoins the p-type base region, the source electrode can be in contact with the high-concentration portions of the n-type source region and the p-type base region, thereby enabling a low on-resistance both in the n-type region and the p-type region.

Thus, the semiconductor device in the present embodiment does not require the formation of the conventionally formed p⁺-type region for contact with the p-type base region, and is therefore simple in configuration, easy to manufacture and advantageous for miniaturization. Moreover, no new mask is needed in the lithographic step of the conventional DIMOSFET to obtain the structure in the present embodiment, and in this respect as well, the semiconductor device in the present embodiment is easy to manufacture and advantageous for miniaturization.

Second Embodiment

Figure 12:
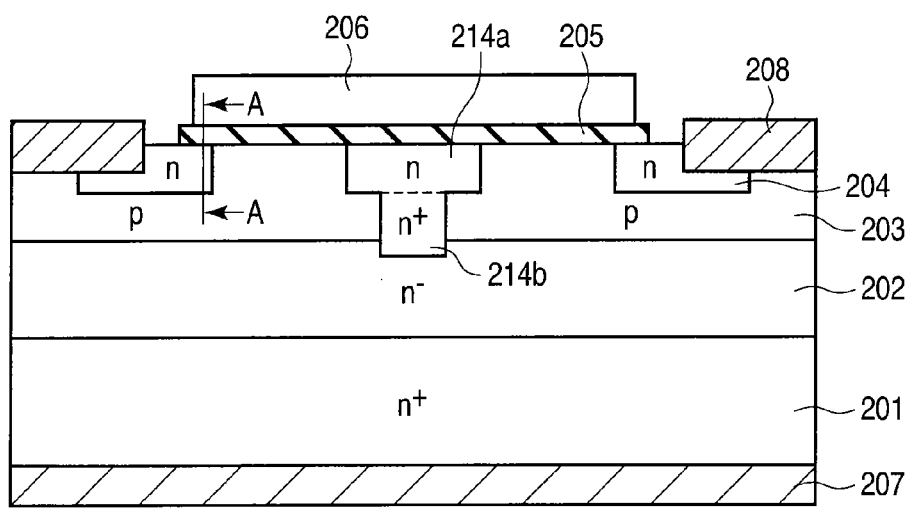
FIG. 12 is a sectional view of a DIMOSFET according to a second embodiment.

FIG. 12 is a sectional view showing the configuration of a DIMOSFET according to a second embodiment. In FIG. 12, an SiC layer (n⁻ layer) 202 including an n-type impurity concentration of about $5 \times 10^{15}$ to $2 \times 10^{16}/cm^3$ and having a thickness of about 5 to 10 μm is formed on a hexagonal 4H—SiC substrate (n⁺ substrate) 201 containing an n-type impurity with a concentration of about $5 \times 10^{18}$ to $1 \times 10^{19}/cm^3$. On the SiC layer 202, a p-type base layer 203 is formed with a thickness of 900 nm so that the concentration of aluminum (Al) as a p-type impurity changes from about $1 \times 10^{16}/cm^3$ to $2 \times 10^{19}/cm^3$ (peak concentration) in the depth direction from the surface.

In the surface of the p-type base layer 203, there are formed an n-type source region 204 of a depth of 450 nm and an n-type region 214a which is formed on the same level as the source region 204, and there is further formed a contact 241b for connecting the n-type SiC layer 202 to the n-type region 214a. Nitrogen (N) is added as an n-type impurity to the n-type source region 204 and the n-type region 214a, and the concentration changes from about $1 \times 10^{18}/cm^3$ to $2 \times 10^{20}/cm^3$ (peak concentration) in the depth direction from the surface. A depth-direction n-type impurity concentration distribution in a section along the line A-A in FIG. 12 is similar to that in FIG. 2 in the first embodiment.

From the outer side of the p-type base layer 203 to part of the n-type source region 204, a trench having a depth of 350 nm is formed in their surfaces, and a source electrode 208 is formed within this trench.

In a part extending from the edge area of the surface of the source region 204 to the surfaces of the base layer 203 and the SiC layer 214a, a gate dielectric 205 having a thickness of about 80 nm is formed across these regions. A gate electrode 206 made of polysilicon is formed on the gate dielectric 205. Further, a drain electrode 207 is formed on the lower surface of the SiC substrate 201.

In the semiconductor device in the second embodiment as well, the surface of the p-type base layer 203 in direct contact with the gate dielectric 205 is formed to have a relatively low impurity concentration of $1 \times 10^{16}/cm^3$, but its surface in contact with the source electrode 208, that is, the bottom of the trench is formed to have a relatively high concentration of $1 \times 10^{18}/cm^3$. Therefore, the p-type base layer 203 can be in ohmic contact with the source electrode 208.

On the other hand, the surface of the n-type source region 204 in direct contact with the gate dielectric 205 is formed to have a relatively low impurity concentration of $1 \times 10^{18}/cm^3$, but its surface in contact with the source electrode 208, that is, the bottom of the trench is formed to have a relatively high concentration (n⁺) of $2 \times 10^{20}/cm^3$. Therefore, the n-type source region 204 can be in ohmic contact with the source electrode 208.

In such a configuration, the gate dielectric 205 in contact with the source region 204 is improved in roughness and crystallinity, which makes it possible to reduce a decrease in mobility caused by an inversion channel due to the roughness and improve the reliability of the gate dielectric 205. Moreover, p⁺ ion implantation into the p-type base layer 203, which has heretofore been carried out, is no longer necessary, leading to a simplified process.

Moreover, in the second embodiment, the n-type region 214a connected to the drift layer 202 is formed in the surface of the p-type base layer 203 at the same time as the formation of the source region 204 using a single mask, and a fixed length of a channel region can be formed. This enables a MOSFET to have uniform characteristics.

Figure 13:
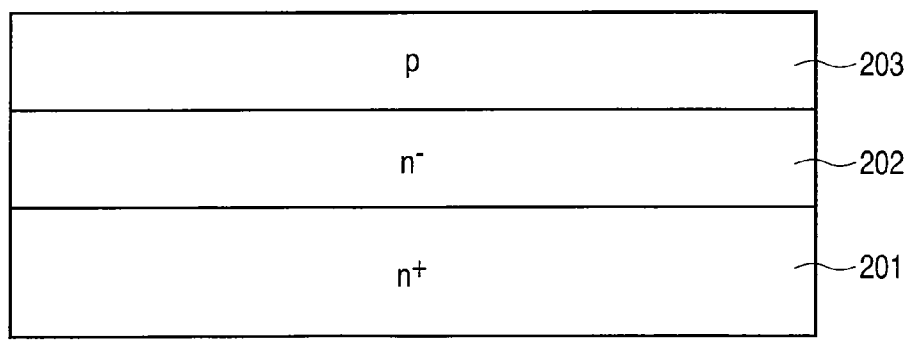

Next, a method of manufacturing the above semiconductor device is described with FIGS. 13 to 18. First, as shown in FIG. 13, the highly resistant (n⁻-type) SiC layer 202 which contains nitrogen (N) as an n-type impurity with a surface impurity concentration of about $1 \times 10^{16}/cm^3$ and which has a thickness of 10 μm is formed by the epitaxial growth method on the low resistant 4H—SiC substrate 201 which contains nitrogen as an n-type impurity with an impurity concentration of $1 \times 10^{19}/cm^3$ and which has a thickness of 300 μm and which has a hexagonal crystal lattice. Although nitrogen (N) is used as the n-type impurity here, other impurities such as phosphorus (P) may be used. Alternatively, nitrogen and phosphorus may be used in combination.

Then, Al ion implantation into the SiC layer 202 is carried out. The Al ion implantation is carried out under the conditions of: substrate temperature Tsub=room temperature to 500° C., here, room temperature, acceleration energy Eacc=600 keV, and total dose $\phi=2.5 \times 10^{14}/cm^2$. As a result, the base layer 203 containing the p-type impurity is formed, as shown in FIG. 13.

Then, as shown in FIG. 14, the source region 204 and the n-type region 214a are selectively formed in the base layer 203 at the same time by ion implantation. Specifically, the phosphorus (P) ion implantation is carried out with the substrate heated to a temperature of about 600° C. under conditions including an acceleration energy of 400 keV and a total dose of $3 \times 10^{15}/cm^2$. At this point, an impurity concentration distribution in a direction along the line A-A in FIG. 14 is as shown in FIG. 2, as described above. Subsequently, the implanted impurity is activated by a thermal treatment at about 1600° C.

Then, as shown in FIG. 15, an n⁺-type contact 214b connecting the n-type region 214a to the drift layer 202 is formed by phosphorus (P) ion implantation.

Then, as shown in FIG. 16, the gate dielectric 205 is selectively formed by, for example, the thermal oxidation method or CVD method across the source region 204, the base layer 203 and the n-type region 214a. At this point, the surface of the source region 204 in direct contact with the gate dielectric 205 is formed to have a relatively low impurity concentration of $1\times10^{18}/cm^3$ as described above, and this inhibits surface roughening due to the high-temperature treatment, so that a flat and dense gate dielectric 205 can be formed on the source region 204, thereby enabling a significant improvement in the long-term reliability of the gate dielectric 205. At this point, the impurity concentration of the surface of the p-type base layer 203 in contact with the gate dielectric 205 is also $1\times10^{18}/cm^3$. Further, a polysilicon layer is formed on the gate dielectric 205 by the CVD method, and the polysilicon layer is patterned by lithography or the RIE method to form the gate electrode 206.

Then, as shown in FIG. 17, a resist 209 covering the gate electrode 206 is formed, and using the resist 209 as a mask, a trench 210 is formed in the surfaces of the n-type source region 204 and the p-type base layer 203 by isotropic etching such as RIE. At this point, the n-type source region exposed in the bottom of the trench is an $n^+$ type with an impurity concentration of about $2\times10^{20}/cm^3$, and forms a satisfactory ohmic contact with the source electrode to be formed later.

Then, as shown in FIG. 18, an Ni film is formed on the entire surface by vapor deposition, and the source electrode 208 is selectively formed by the liftoff method. Further, the drain electrode 207 is also formed on the rear surface by the vapor deposition of an Ni film. Finally, a sinter treatment is performed at 950° C. for about five minutes to provide a satisfactory ohmic contact between the source electrode 208 and the drain electrode 207. Consequently, the DIMOSFET in the second embodiment shown in FIG. 17 is completed.

In the DIMOSFET manufactured as described above, the n-type impurity is formed with a relatively low concentration in a relevant part within the source region 204 in direct contact with the gate dielectric 205, such that surface roughening on the source region due to a high-temperature treatment of about 1600° C. is inhibited, and a flat and dense gate dielectric can be obtained on this region, and moreover, the reliability of the gate dielectric 205 can be improved to a great extent.

Moreover, the n-type region 214a connected to the drift layer 202 is formed in the surface of the p-type base layer 203 with the same mask as the source region 204, and a channel region of fixed length can be formed. This enables the MOSFET to have uniform characteristics.

Furthermore, it goes without saying that an IGBT can be formed as in the first embodiment if a p-type base substrate is formed.

Third Embodiment

FIG. 19 is a sectional view showing the configuration of a horizontal DIMOSFET according to a third embodiment. This DIMOSFET may be basically considered to be a horizontal type of the DIMOSFET in the first embodiment. In FIG. 19, a p-type base region 303 and a source region 304 formed therein are selectively formed at the upper left of an n-type silicon carbide substrate 300 (N) to which nitrogen is added, as in the first embodiment. Adjacently to the p-type base region 303, a low-concentration third silicon carbide region 302 (N) to which nitrogen is added is formed on the silicon carbide substrate 300.

As described above, the p-type base region 303 is formed with a thickness of 900 nm so that the concentration of aluminum (Al) as a p-type impurity changes from about $1\times10^{16}/cm^3$ to $2\times10^{19}/cm^3$ (peak concentration) in the depth direction from the surface.

The n-type source region 304 is formed with a depth of 500 nm so that the concentration of nitrogen (N) as an n-type impurity changes from about $1\times10^{18}/cm^3$ to $2\times10^{20}/cm^3$ (peak concentration) in the depth direction from the surface.

A depth-direction n-type impurity concentration distribution in a section along the A-A line in FIG. 19 is similar to that in FIG. 2.

From the outer side of the p-type base region 303 to part of the n-type source region 304, a trench having a depth of 350 nm is formed in their surfaces, and a source electrode (first electrode) 308 is formed within this trench.

In a part extending from the edge area of the surface of the source region 304 to the surfaces of the base region 303 and the n-type region 302, a gate dielectric 305 having a thickness of about 50 nm is formed across these regions. A gate electrode 306 made of polysilicon is formed on the gate dielectric 305.

At the upper right of the n-type region 302, an n-type drain region 301 to which P is added is formed separately from the p-type base region 303, on which a drain electrode (second electrode) 307 is formed. The upper surfaces of the n-type region 302 and the drain region 301 are selectively covered with a dielectric 311.

Figure 20:
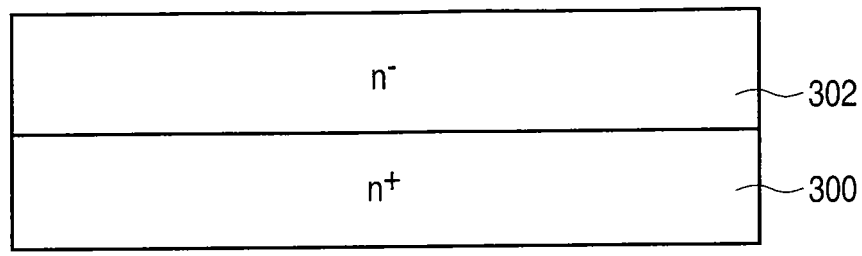
FIGS. 20 to 24 are sectional views for explaining stepwise the process of manufacturing the DIMOSFET according to the third embodiment.

Next, a method of manufacturing the above DIMOSFET is described with FIGS. 20 to 24. First, as shown in FIG. 20, the highly resistant ($n^-$-type) SiC layer 302 which contains nitrogen (N) as an n-type impurity with a surface impurity concentration of $1\times10^{16}/cm^3$ and which has a thickness of 600 nm is sequentially formed by the epitaxial growth method on the low resistant 4H—SiC substrate 300 which contains nitrogen as an n-type impurity and which has a thickness of about 300 µm and which has a hexagonal crystal lattice.

Figure 21:
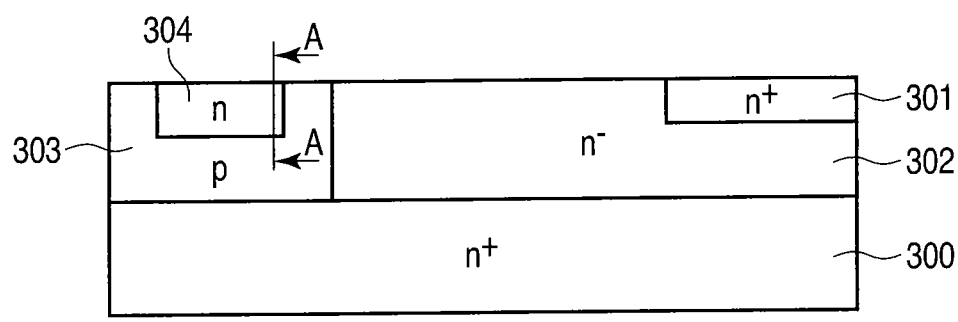

Then, as shown in FIG. 21, Al ion implantation into the SiC layer 302 is carried out. Multistage ion implantation is carried out for Al under the conditions of: substrate temperature Tsub=room temperature to 600° C., here, room temperature, acceleration energy Eacc=600 keV, and total dose $\phi=2.5\times10^{14}/cm^2$. As a result, the base region 303 containing the p-type impurity is formed.

Then, the source region 304 is selectively formed in the base region 303 by ion implantation. Specifically, phosphorus (P) ion implantation is carried out with the substrate heated to a temperature of about 600° C. under conditions including an acceleration energy of 400 keV and a total dose of $3\times10^{15}/cm^2$. At this point, an impurity concentration distribution in a direction along the line A-A in FIG. 20 is as shown in FIG. 2, as described above. Subsequently, the implanted impurity is activated by a thermal treatment at about 1600° C.

Then, the $n^+$-type drain region 301 is formed in the n-type region 302 separately from the p-type base layer.

Figure 22:
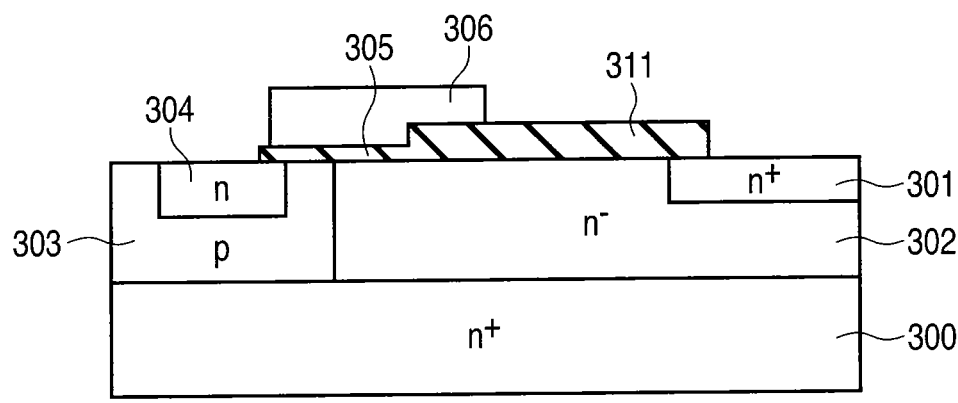

Then, as shown in FIG. 22, the gate dielectric 305 is selectively formed by, for example, the thermal oxidation method or CVD method across the SiC layer 302, the base region 303 and the source region 304. Further, the dielectric 311 is selectively formed partly on the upper surface of the SiC region 302 and the upper surface of the drain region 301. At this point, the surface of the source region 304 in direct contact with the gate dielectric 305 is formed to have a relatively low impurity concentration of $1\times10^{18}/cm^3$ as described above, and this inhibits surface roughening due to the high-temperature treatment, so that a flat and dense gate dielectric 305 can be formed on the source region 304, thereby enabling a significant improvement in the long-term reliability of the gate dielectric 305. At this point, the impurity concentration of the surface of the p-type base region 303 in contact with the gate dielectric 305 is also $1\times10^{18}/cm^3$. Further, a polysilicon layer is formed on the gate dielectric 305 by the CVD method, and the polysilicon layer is patterned by lithography or the RIE method to form the gate electrode 306.

Figure 23:
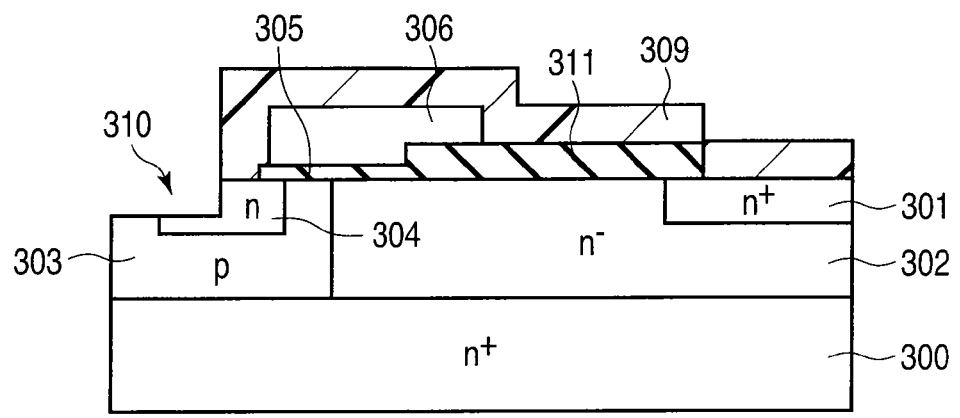

Then, as shown in FIG. 23, a resist 309 covering the gate electrode 306 is formed, and using the resist 309 as a mask, a trench 310 is formed in the surfaces of the n-type source region 304 and the p-type base region 303 by isotropic etching such as RIE. At this point, the n-type source region exposed in the bottom of the trench is an $n^+$ type with an impurity concentration of about $2 \times 10^{20}/cm^3$, and forms a satisfactory ohmic contact with the source electrode to be formed later.

Figure 24:
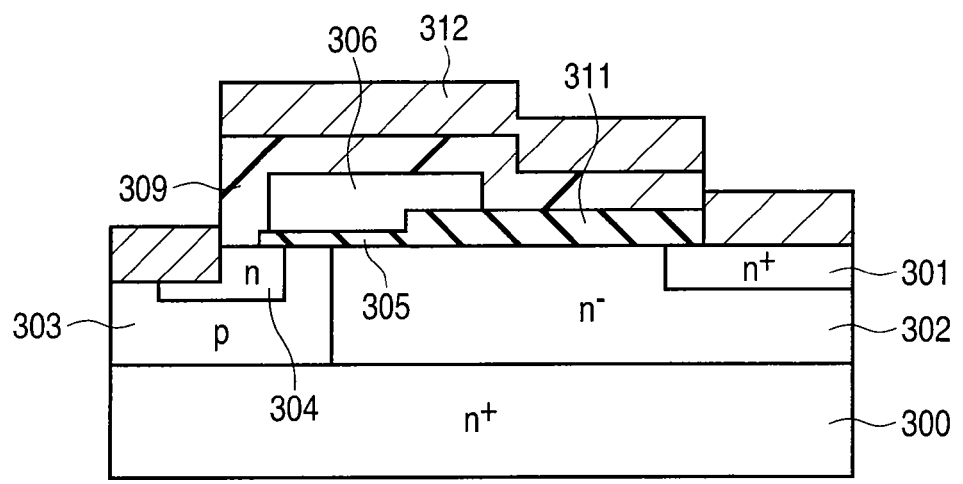

Then, as shown in FIG. 24, an Ni film 312 is formed on the entire surface by vapor deposition after the resist mask 309 on the drain region 301 has been removed, and the source electrode 308 and the drain electrode 307 are selectively formed by the liftoff method. Finally, a sinter treatment is performed at 950° C. for about five minutes to provide the source electrode 308 and the drain electrode 307 with a satisfactory ohmic contact. Consequently, the horizontal DIMOSFET in the third embodiment shown in FIG. 19 is completed.

As described above, in the DIMOSFET in the third embodiment, the n-type impurity is formed with a relatively low concentration in a relevant part within the source region 304 in direct contact with the gate dielectric 305 as in the first embodiment, such that surface roughening on the source region due to a high-temperature treatment of about 1600° C. is inhibited, and a flat and dense gate dielectric can be obtained on this region, and moreover, the reliability of the gate dielectric 305 can be improved to a great extent.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope of and spirit of the inventions.

What is claimed is:

1. A semiconductor device comprising:
   a silicon carbide substrate of a first conductivity type or a second-conductivity type having a first main surface and a second main surface opposite to each other;
   a silicon carbide layer of the first conductivity type formed on the first main surface of the silicon carbide substrate;
   a first silicon carbide region of the second conductivity type formed on a surface of the silicon carbide layer;
   a second silicon carbide region of the first conductivity type formed within a surface of the first silicon carbide region;
   a gate dielectric continuously formed in contact with the silicon carbide layer, a part of the second silicon carbide region and the surface of the first silicon carbide region interposed between the silicon carbide layer and the second silicon carbide region;
   a gate electrode formed on the gate dielectric;
   a first electrode embedded in a trench selectively formed in a boarding area of the first silicon carbide region and another part of the second silicon carbide region uncovered with the gate dielectric, a bottom of the trench being placed on an area including a part crossing a junction between the first silicon carbide region and the second silicon carbide region; and
   a second electrode formed on the second main surface of the silicon carbide substrate.

2. The semiconductor device according to claim 1, wherein an impurity concentration in a part of the first silicon carbide region in contact with the gate dielectric is lower than that of the first silicon carbide region in contact with a bottom surface of the trench.

3. The semiconductor device according to claim 1, wherein an impurity concentration in a part of the second silicon carbide region in contact with the gate dielectric is lower than that of the second silicon carbide region in contact with a bottom surface of the trench.

4. The semiconductor device according to claim 1, wherein the first silicon carbide region contains aluminum as an impurity, and a concentration of aluminum in a part of the first silicon carbide region in contact with the gate dielectric is less than $1 \times 10^{17}/cm^3$.

5. The semiconductor device according to claim 1, wherein the second silicon carbide region contains phosphorus as an impurity, and a concentration of phosphorus in a part of the second silicon carbide region in contact with the gate dielectric is less than $1 \times 10^{19}/cm^3$.

6. The semiconductor device according to claim 1, wherein the first silicon carbide region contains aluminum as an impurity, and a concentration of aluminum in the first silicon carbide region at a bottom surface of the trench is $1 \times 10^{17}/cm^3$ or more.

7. The semiconductor device according to claim 1, wherein the second silicon carbide region contains phosphorus as an impurity, and a concentration of phosphorus in a surface of the second silicon carbide region exposed in the trench is $1 \times 10^{19}/cm^3$ or more.

* * * * *